United States Patent [19]

Heermann et al.

[11] Patent Number: 5,833,816
[45] Date of Patent: Nov. 10, 1998

[54] APPARATUS FOR TREATING PRINTED CIRCUIT BOARDS

[75] Inventors: Marcel Heermann, Merelbeke; Daniel Hosten, Handzame, both of Belgium

[73] Assignee: Siemens S.A., Brussels, Belgium

[21] Appl. No.: 737,260

[22] PCT Filed: May 11, 1995

[86] PCT No.: PCT/EP95/01790

§ 371 Date: Nov. 12, 1996

§ 102(e) Date: Nov. 12, 1996

[87] PCT Pub. No.: WO95/31590

PCT Pub. Date: Nov. 23, 1995

[30] Foreign Application Priority Data

May 11, 1994 [DE] Germany ............ 44 16 710.5

[51] Int. Cl.$^6$ ............ C25D 17/00; C25D 17/02; C25D 21/10
[52] U.S. Cl. ............ 204/198; 204/202; 204/237; 204/269; 204/270; 204/273; 204/278; 118/429
[58] Field of Search ............ 204/198, 237, 204/269, 270, 278, 202, 273; 118/429

[56] References Cited

U.S. PATENT DOCUMENTS

| | | | |
|---|---|---|---|
| 4,155,815 | 5/1979 | Francis et al. ............ | 204/198 X |
| 4,372,825 | 2/1983 | Eidschun . | |
| 4,394,241 | 7/1983 | Scanlon ............ | 204/198 |
| 4,401,522 | 8/1983 | Buschow et al. . | |
| 4,595,451 | 6/1986 | Holzer ............ | 204/237 X |
| 5,417,828 | 5/1995 | Sergio ............ | 204/237 X |

FOREIGN PATENT DOCUMENTS

0 254 962 B1  3/1988  European Pat. Off. .
0 421 127 A1  10/1991  European Pat. Off. .

*Primary Examiner*—Donald R. Valentine
*Attorney, Agent, or Firm*—Hill & Simpson

[57] ABSTRACT

The printed circuit boards (LP) are conducted through treatment baths (BB1 through BB3) in vertical attitude on at least two horizontal conveying paths (TW1 through TW4) proceeding next to one another, these treatment baths being accommodated in treatment cells (BZ10 through BZ13, BZ20 through BZ23, BZ30 through BZ33) that are arranged successively and next to one another. The end walls of the treatment cells are provided with vertical slots (S) and allocated seals (D) for the passage of the printed circuit boards. The bath liquid emerging from treatment cells arranged next to one another is collected in common collecting tanks (AW1 through AW3) and is returned into the treatment cells with the assistance of pumps (P). A common treatment cell for treatment zones lying next to one another can also be provided in a common collecting tank. The conveying of the printed circuit boards on the conveying paths lying next to one another preferably ensues with a common conveyor device. A cost-beneficial doubling or, respectively, multiplication of the printed circuit board throughput derives due to the two-lane or multi-lane treatment.

36 Claims, 5 Drawing Sheets

APPARATUS FOR TREATING PRINTED CIRCUIT BOARDS

BACKGROUND OF THE INVENTION

European reference EP-A-0 254 962 discloses an apparatus for the through-contacting and electroplating of printed circuit boards wherein the individual printed circuit boards are continuously conducted through successively arranged treatment baths in horizontal attitude on a horizontal conveying path. The transport of the printed circuit boards through the treatment baths accommodated in treatment cells ensues via horizontally arranged conveyor rollers or via clamps arranged at endlessly circulating drives that seize the lateral edges of the printed circuit boards. In the case of an electroplating treatment, the clamps also simultaneously assume the cathodic contacting of the printed circuit boards. Horizontal slots for the passage of the printed circuit boards are located in the end walls of the treatment cells, whereby roller pairs that are horizontally arranged and that are drive with a speed matched to the speed of the traversing printed circuit boards are allocated to these horizontal slots as seals. The bath liquid emerging from the individual treatment cells is collected in allocated collecting tanks and is continuously returned into the allocated bath cells with the assistance of appropriate pumps. Maintaining a constant level in the individual treatment cells is enabled by the continuous return of the bath liquid.

European reference EP-A-0 421 127 discloses an apparatus for the treatment of printed circuit boards wherein the individual printed circuit boards are continuously conducted through successively arranged treatment baths in a vertically suspended attitude on a horizontal conveying path. The transport of the printed circuit boards through the baths accommodated in treatment cells ensues via clamps arranged at endlessly circulating drives that, in the case of an electroplating treatment, also simultaneously assume the cathodic contacting of the printed circuit boards. Vertical slots for the passage of the printed circuit boards are located and the end walls of the treatment cells, whereby seals fashioned as brush seals or strip brush seals are provided in the passage region. The individual treatment cells are arranged in collecting tanks from which the collected bath liquid is continuously returned into the allocated treatment cells with the assistance of appropriate pumps. Here, too, the continuous return of the bath liquid enables the maintaining of a constant level in the individual treatment cells.

U.S. Pat. No. 4,401,522 discloses a similarly constructed apparatus for the electrolytic treatment of printed circuit boards wherein vertically arranged roller pairs are allocated as seals to the vertical slots in the end walls of the treatment cells. The rollers of these roller pairs composed of elastic material are resiliently pressed against one another and driven with a speed that is matched to the conveying speed of the traversing printed circuit boards.

SUMMARY OF THE INVENTION

It is an object of the present invention to provide an apparatus for the treatment of printed circuit boards in successively arranged treatment baths wherein a clear increase of the throughput can be achieved with relatively little added outlay. In general terms the present invention is an apparatus for treating printed circuit boards. The conveyor system continuously conducts the printed circuit boards through successively arranged treatment baths in vertical attitude on at least two horizontal conveying paths proceeding next to one another. Treatments cells are arranged successively and next to one another for the acceptance of the treatment baths. The end walls of the treatment cells have vertical slots for the passage of the printed circuit boards. Seals are allocated to the slots. Common collecting tanks are provided for the bath liquid emerging from treatment cells arranged next to one another. Pumps are provided for the continuous return of bath liquid from the collecting tanks into the allocated treatment cells.

In general terms the present invention is also an apparatus for treating printed circuit boards having the above-described conveyor system that continuously conducts the printed circuit boards through successively arranged treatment baths in vertical attitude on at least two horizontal conveying paths proceeding next to one another. Treatment cells are successively arranged for the acceptance of the treatment baths. The end walls of the treatment cells have vertical slots for the passage of the printed circuit boards. Seals are allocated to the slots. Collecting tanks are provided for the bath liquid emerging from treatment. Pumps are provided for the continuous return of bath liquid from the collecting tanks into the allocated treatment cells.

The invention is based on the perception that a treatment of the printed circuit boards in vertical attitude enables a compact, space-saving arrangement with at least two conveying paths that proceed parallel next to one another and at the same level, whereby the employment of common collecting tanks already leads to a substantial reduction of the overall outlay compared to separately constructed individual systems. In one embodiment common collecting tanks are thereby provided for the bath liquid emerging from treatment cells arranged next to one another. In another embodiment, both a common collecting tank as well as a common treatment cell are provided for the treatment zones allocated to the conveying paths and arranged next to one another. A doubling or, respectively, multiplication of the throughout is thus enabled, whereby a common collecting tank, a common heating or cooling, a common level monitoring in the reservoir, a common pump of appropriate capacity and the common employment of further components enable substantial savings for the treatment zones arranged next to one another in the parallel conveying paths. It should also be emphasized that the accessibility of the individual treatment baths, an effective bath monitoring and a simple maintenance of the overall apparatus are fully assured even given a plurality of parallel conveying paths.

What are to be understood in the present invention by the term "printed circuit boards" are not only conventional, bored printed circuit boards but other plate-shaped wirings as well that can also multiply traverse the apparatus under certain conditions for building up a plurality of wiring levels. In addition to the conventional through-contacting and electroplating of printed circuit boards with the corresponding pretreatment and after-treatment steps, an electro-immersion lacquering of the printed circuit boards can also be undertaken, for example, in the inventive apparatus. The layers applied by electro-immersion lacquering can thereby serve as galvano-resist, as etching resist, as solder stop lacquer or also as insulating intermediate layers in the construction of multi-layer wirings. According to the present invention, the printed circuit boards are conducted in vertical attitude through vertical slots in the end walls of the treatment cells, whereby the term "vertical", however, is not intended to mean a limitation to an absolutely vertical alignment. By contrast to apparatus with the prevailing horizontal arrangement, however, the advantages of the invention can likewise be realized with a slightly inclined arrangement of printed circuit boards and slots.

The conveyor means provides a suspended conveying of the printed circuit boards. This enables a suspended conveying of the printed circuit boards that is especially simple to realize.

The conveyor means is fashioned as clamps. This enables a simple and reliable holding of the printed circuit boards by clamps, whereby such clamps are also particularly suited for an automatic charging and removal of the printed circuit boards.

Guides for the printed circuit boards are arranged in the treatment cells. This assures a reliable conveying of the printed circuit boards through the treatment cells in vertical attitude.

The conveyor means of the conveying paths proceeding next to tone another are combined to form a common conveyor device. The common conveyor device is equipped with guide rollers running on guide rails. As a result of the common conveyor means for the conveying paths that proceed next to one another, the improvement of claim 6 enables another substantial reduction of the overall outlay. The employment of guide rails and guide rollers according to claim 7 guarantees a reliable guidance of the conveyor means even given three or more conveying paths.

The conveyor means of the common conveyor device are driven by at least one endlessly circulating drive. The endlessly circulating drive is formed by a chain. This enables a further simplification of the conveying of the printed circuit boards, whereby the employment of an endlessly circulating chain has proven itself as an especially reliable and rugged drive means.

The arrangement has contacting elements for anodic or cathodic contacting of the printed circuit boards and electrodes with the opposite polarity of the contacting elements that are arranged in electrolytic treatment cells. The electrodes are arranged at both sides of the conveying paths of the printed circuit boards. This enables an electrolytic treatment of the printed circuit boards, whereby the arrangement of the electrodes at both sides of the conveying paths assures a high uniformity and effectiveness of this electrolytic treatment.

The contacting elements are formed by the conveyor means and the power supply to the conveyor means ensues with wiper contacting or roller contacting. Thus the electrical contacting of the printed circuit boards given an electrolytic treatment can be undertaken via the conveyor means in an especially simple and reliable way.

At least one cleaning bath for chemical or electrochemical cleaning of the conveyor means is arranged in the region of the returning side of the endless drive. This enables a simple elimination of metal deposits on the conveyor means by chemical or anodic etching.

The return of the bath liquid ensues at least partially via spray pipes arranged in the appertaining treatment cell. The pipes are vertically aligned. The spray pipes are arranged at both sides of the conveying paths of the printed circuit boards. This enables an especially effective treatment of the printed circuit boards by the continuous and targeted delivery of bath liquid to the printed circuit boards. A vertical alignment of the pray pipe has thereby particularly proven itself, whereas an arrangement of the spray pipe at both sides of the conveying paths assures an identical and uniform treatment of both printed circuit board sides.

Means are provided for introducing compressed air into the treatment baths. This enables a further increase in the intensity of the treatment by forming micro-turbulences. Thus, for example, the introduction of compressed air into an electrolytic treatment cell enables higher current densities and, thus, a shortening of the overall length of the apparatus.

The seals are formed by cylinders loosely arranged in pairs in vertical alignment that are pressed against one another or against the respectively passing printed circuit boards by the pressure of a treatment bath. This enables an especially simple and effective sealing of the slots required for the passage of the printed circuit boards. The seals are arranged in sluice chambers attached to the treatment cells at the end side. The loose and vertical alignment of the cylinders employed as seal can be assured in a simple way by the accommodation thereof in sluice chambers.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
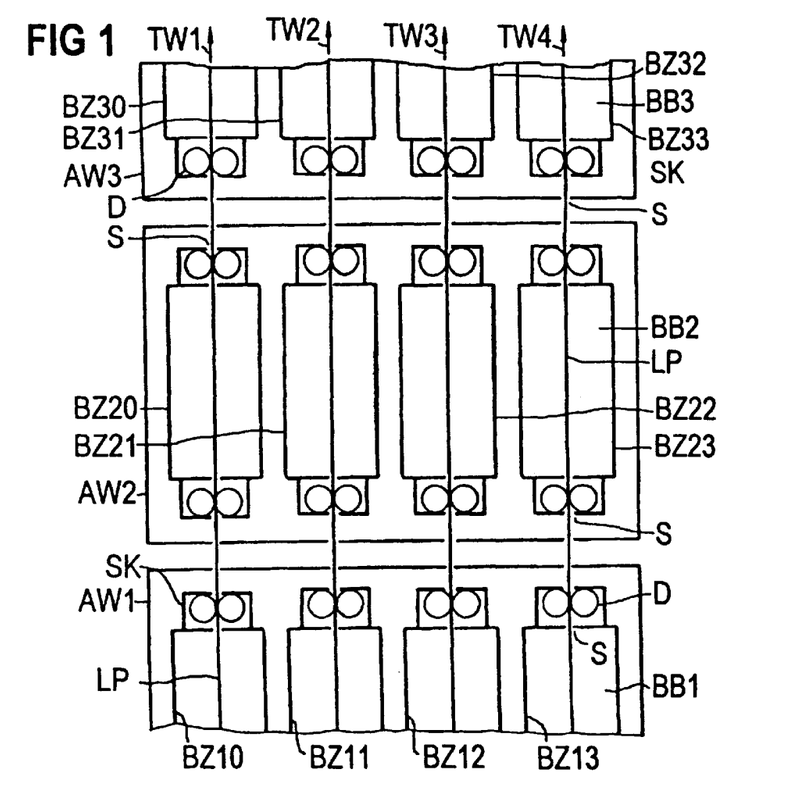
FIG. 1 and FIG. 2 depict a first embodiment of an apparatus for the multi-lane treatment of printed circuit boards in plan view or, respectively, cross-section.
Figure 2:
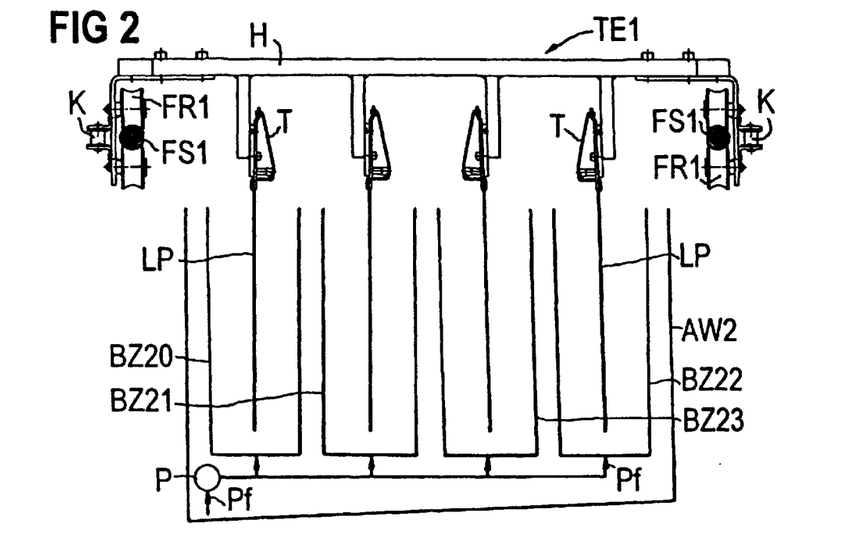

In highly simplified schematic fashion, FIGS. 1 and 2 show a first exemplary embodiment of an apparatus for the treatment of printed circuit boards LP that are conducted through successively arranged treatment baths with the assistance of conveyor means T, being guided in vertically suspended attitude on four horizontal conveying paths TW1, TW2, TW3 and TW4 that proceed parallel next to one another and at the same level. In the portion of the apparatus shown in FIG. 1, these successively arranged treatment baths are referenced BB1, BB2 and BB3.

Four treatment cells BZ10, BZ11, BZ12 and BZ13 that are erected in a common collecting tank AW1 and arranged side by side and allocated to the conveying paths are provided for the acceptance of the treatment bath BB1.

Four treatment cells BZ20, BZ21, BZ22 and BZ23 that are erected in a common collecting tank AW2 and arranged side by side and allocated to the conveying paths are provided for the acceptance of the treatment bath BB2.

Four treatment cells BZ30, BZ31, BZ32 and BZ33 that are erected in a common collecting tank AW3 and arranged side by side and allocated to the conveying paths are provided for the acceptance of the treatment bath BB3.

The end walls of all treatment cells are provided with vertical slots S that are dimensioned such that the printed circuit boards LP can be conducted through unimpeded along the conveying paths TW1 through TW4. Sluice chambers SK attached to the treatment cells at the end face accepts seals referenced D that greatly reduce the emergence of bath liquid from the vertical slots S. The seals D are a matter of cylinder loosed arranged in pairs in vertical alignment that are pressed against one another are against the respectively passing printed circuit board by the pressure of the bath liquid. The end walls and the common collecting tanks AW1 through AW3 are provided with vertical slots for the passage of the printed circuit boards, just like the end walls of the treatment cells.

The bath liquid emerging from the individual treatment cells in the region of the slots S or overflowing from the treatment cells is collected in the allocated, common collecting tanks AW1, W2 or AW3. It can be seen from the cross-section through the four treatment cells BZ20 through BZ23 and their common collecting tank AW2 shown in FIG. 2 that the collected bath liquid is continuously returned into the allocated treatment cells BZ20 through BZ23 with the assistance of a common pump P, whereby this return is indicate by arrows Pf. A constant level of the bath liquid can be maintained in the treatment cells BZ20 through BZ23 in this way.

It can also be seen from the cross-section shown in FIG. 2 that the four conveyor means T fashioned as clamps are part of a common conveyor device TE1. The conveyor means T are thereby secured at a distance from the allocated conveying paths TW1 through TW4 (see FIG. 1) at common holders H that are in turn guided via guide rollers FR1 on round guide rails FS1 proceeding at both sides. The drive of the entire conveyor device TE1 ensues via chains K that are coupled to the holders H at both sides and respectively endlessly circulate. The common conveyor device TE1 also offers the possibility of an anodic or cathodic contacting of the printed circuit boards LP above electrolytic treatment cells. This possibility of contacting, however, shall only be discussed in greater detail in conjunction with the conveyor device TE2 shown in FIGS. 7 and 8.

Figure 3:
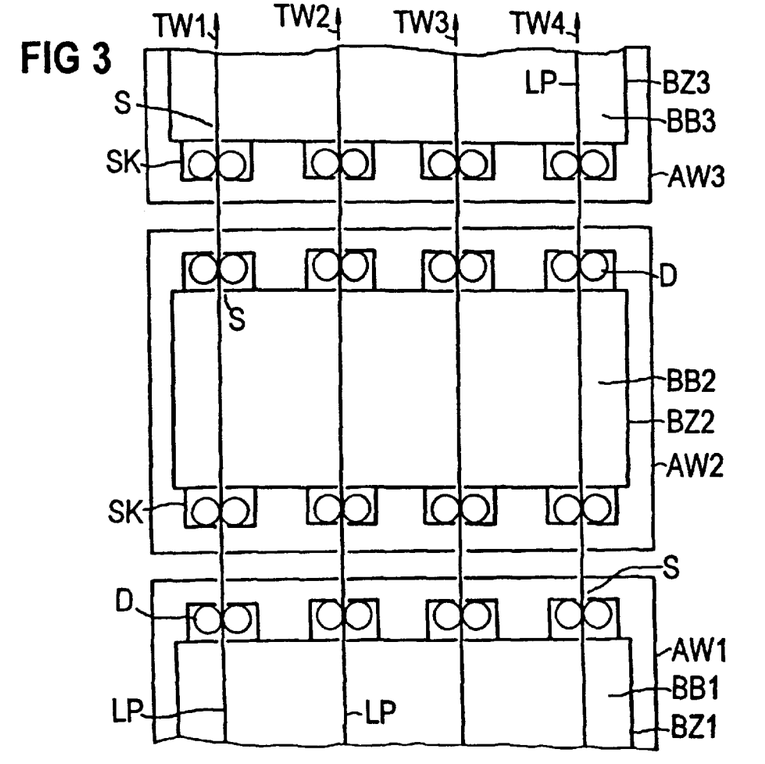
FIG. 3 and FIG. 4 depict a second embodiment of an apparatus for the multi-lane treatment of printed circuit boards in plan view or, respectively, cross-section.
Figure 4:
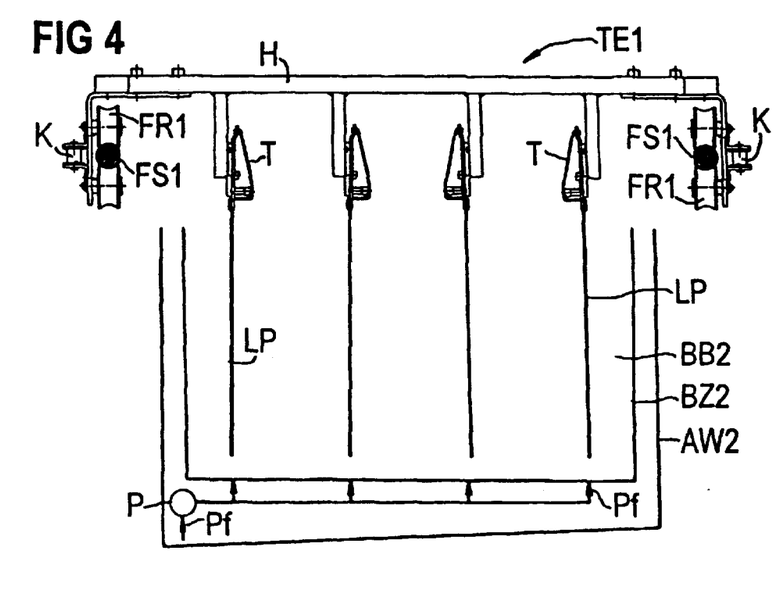

In a highly simplified schematic illustration, FIGS. 3 and 4 show a second exemplary embodiment of an apparatus for the treatment of printed circuit boards LP that, as in the first exemplary embodiment, are again conducted through successively arranged treatment baths in vertically suspended attitude with the assistance of conveyor means T on four conveying paths TW1, TW2, TW3 and TW4 that proceed parallel next to one another and at the same level. In view of the largely identical structure of the exemplary embodiments shown in FIGS. 1 and 2 or, respectively, FIGS. 3 and 4 and of the employment of the same reference characters for identical parts and baths, it is particularly the differences between the two exemplary embodiments that shall be discussed below.

In the second exemplary embodiment shown in FIGS. 3 and 4, respectively common treatment cells that are referenced BZ1, BZ2 and BZ3 in the portion of the overall apparatus shown in FIG. 3 are provided instead of four individual treatment cells arranged next to one another for the accommodation of the treatment baths BB1 through BB3.

The accommodation of the treatment bath BB1 thus ensues in the common treatment cell BZ1 through which the four conveying paths TW1 through TW4 lead. Vertical slots S and sluice chambers SK with seals D are also provided here at the passage locations for the printed circuit boards LP. The common treatment cell is again erected in the common collecting tank AW1.

The following treatment baths BB2 and BB3 are accommodated in the common treatment cells BZ2 and BZ3 in a corresponding way, whereby these common treatment cells BZ2 and BZ3 are erected in the allocated, common collecting tanks AW2 or, respectively, AW3.

According to the cross-section shown in FIG. 4, the return of the bath liquid collected, for example, in the common treatment [sic] tank AW2 into the common treatment cell BZ2 ensues at four locations. A common return of the bath liquid or other ways of returning and distributing the bath liquid, however, are likewise possible.

Figure 5:
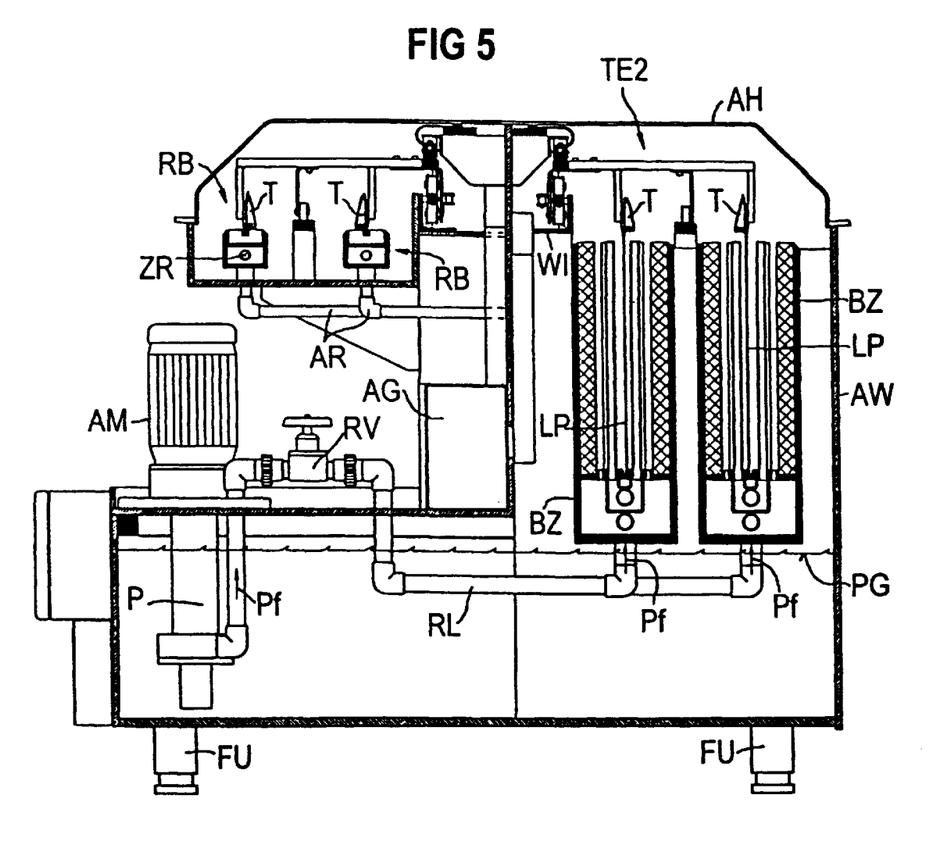
FIG. 5 is a cross-section through an electrolytic treatment module with two treatment cells arranged next to one another.

FIG. 5 shows a cross-section through and electroplating treatment module with two electrolytic treatment cells BZ arranged next to one another that are arranged in a common collecting tank AW. The collecting tank AW, which is erected on feet FU and closed at the top with a removable cover hood AH, contains a supply of the electrolytic treatment bath whose level reading is referenced PG. In addition to this function as reservoir, the common collecting tank AW also has the job of accepting the bath liquid emerging from the two treatment cells BZ. A pump P fashioned as immersion pump is arranged within the collecting tank AW for keeping the level constant in the two treatment cells BZ, so that the bath liquid can be continuously returned into the treatment cells BZ in the direction of the arrows Pf via a return conduit RL. For setting the returned amount, a control valve RV inserted into the return conduit RL is located outside the collecting tank AW next to the drive motor AM of the pump P.

Figure 6:
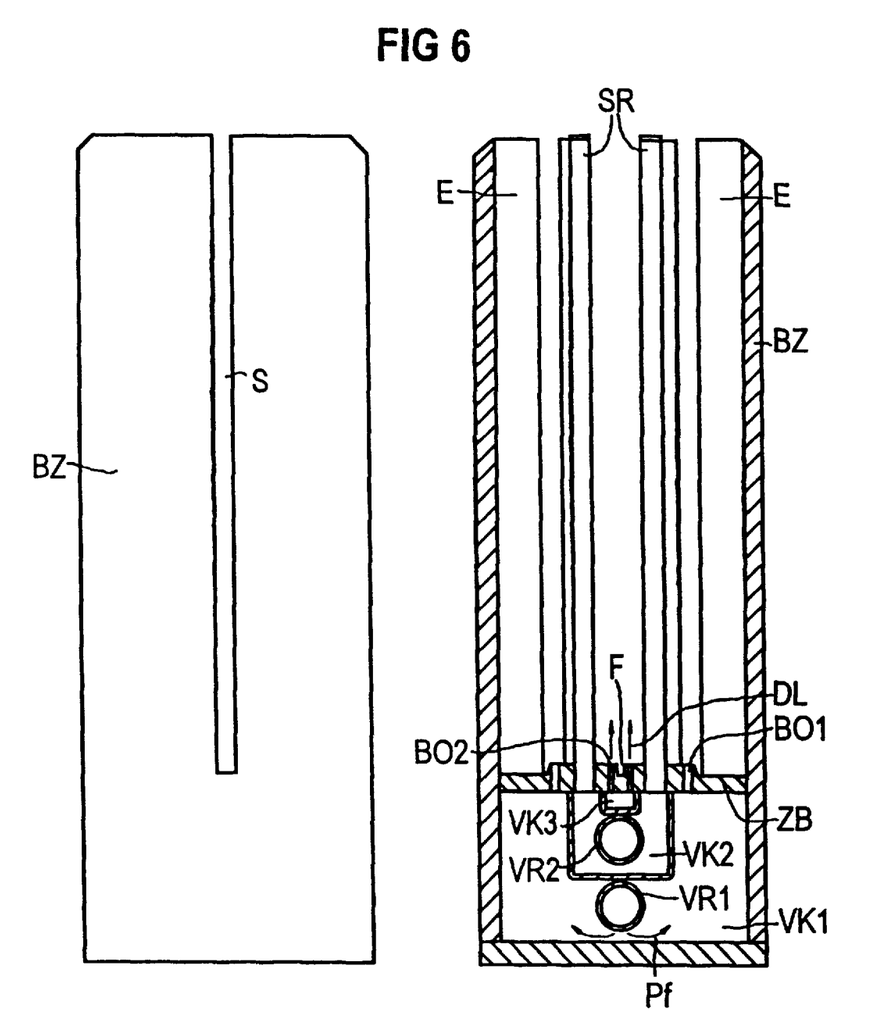
FIG. 6 depicts the two treatment cells of the treatment module shown in FIG. 5 in a face end plan view or, respectively, cross-section.

FIG. 6 is additionally referenced for further explanation of the two electrolytic treatment cells BZ arranged in the collecting tank AW. It can be seen at the treatment cell BZ shown at the left in FIG. 6 that their end faces have slots S for the passage of the printed circuit boards LP. Further details of these slots S and of the allocated sluice chambers SK and seals D were already discussed in conjunction with FIG. 1. A first distribution chamber VK1 into which a part of the bath liquid conveyed back by the pump P discharges via a first distribution pipe VR1 is formed in the lower region of the treatment cells BZ by a false floor ZB. At its underside, this first distribution pipe VR1 is provided with holes arranged spaced from one another through which the bath liquid emerges, as indicated in FIG. 6 by the arrows Pf. In a similar way, two rows of bores BO1 arranged spaced from one another are located in the false floor ZB, the bath liquid being conducted from the first distribution chamber VK1 vertically upward through these bores BO1 into the actual electroplating zone.

A second distribution chamber VK2 is arranged inside the first distribution chamber VK1 suspended at the false floor ZB, the other part of the bath liquid conveyed back by the pump P being introduced into this second distribution chamber VK2 via a second distribution pipe VR2. The bath liquid then proceeds from this second distribution chamber VK2 into spray pipes SR that are secured residing vertically in the false floor ZB at both sides of the conveying path of the printed circuit boards LP. At their insides, the spray pipes SR arranged in two rows comprise a plurality of spray nozzles not shown in detail in the drawing via which the traversing printed circuit boards LP are directly charged with fresh bath liquid.

A third distribution chamber VK3 into which compressed air is introduced is arranged inside the second distribution chamber VK2 suspended at the false floor ZB. The compressed air indicated by arrows DL then proceeds into the electroplating zone via two rows of bores BO2 introduced into the false floor ZB. A guide F for the printed circuit boards LP that is introduced into the false floor ZB as a U-shaped channel is situated between the two rows of these bores BO2.

Electrodes E that extend along the sidewalls in conveying direction are located inside the electrolytic treatment cells BZ arranged above the false floor ZB at both sides of the conveying path. In the illustrated electrolytic treatment module, these electrodes are anodes that, for example, are composed of titanium baskets and copper balls accommodated therein in the case of an electrodeposition of copper.

It can also be seen from the cross-section shown in FIG. 6 that the two sidewalls of the treatment cells BZ are provided with bevels that are not referenced in detail. As a result thereof, the upper edge of the sidewalls form a defined free-overfall weir over which the bath liquid conveyed back into the treatment cells constantly flows.

Figure 7:
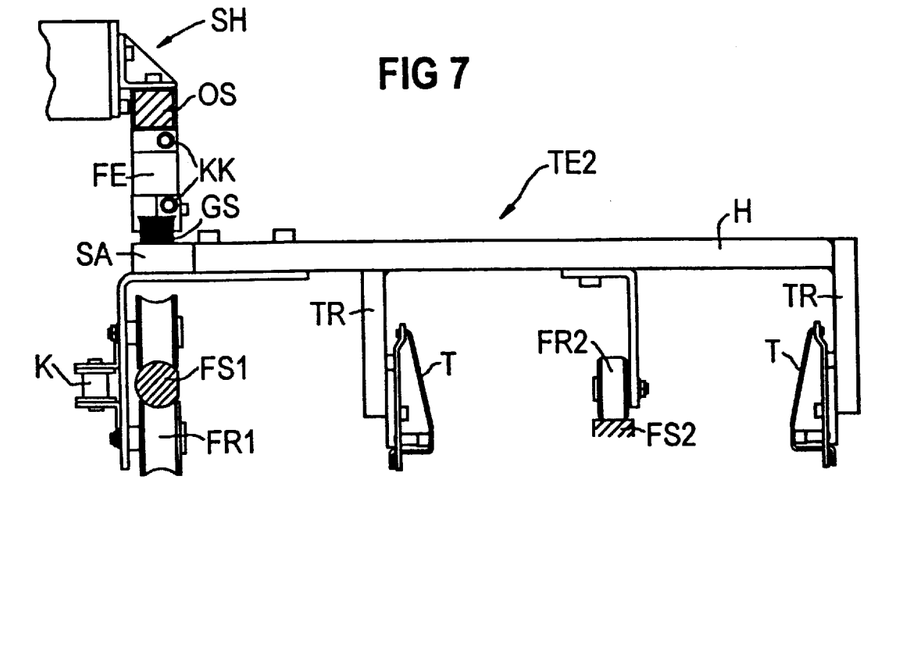
FIG. 7 is a cross-section of the conveyor means of the treatment module shown in FIG. 5.
Figure 8:
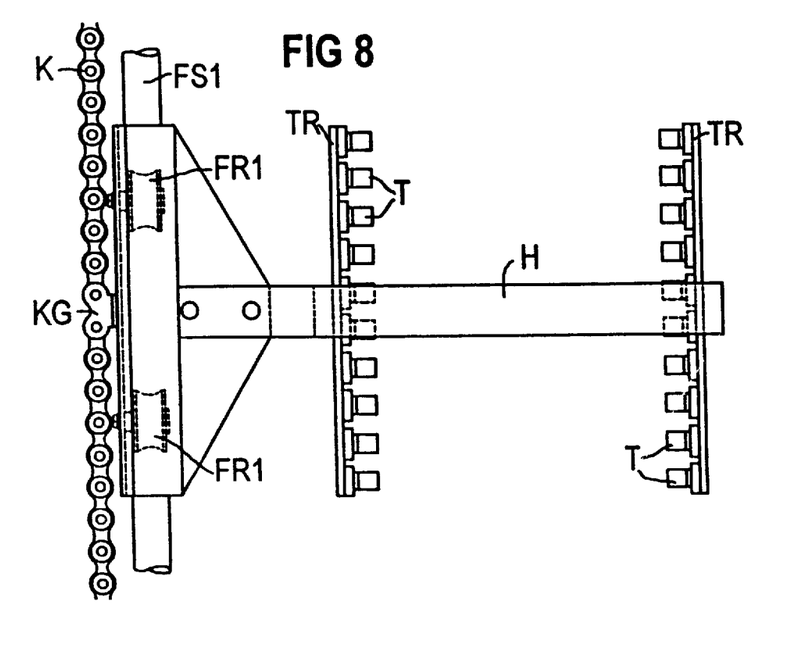
FIG. 8 is a plan view onto the conveyor means of claim 7.

The transport of the printed circuit boards LP on two conveying paths proceeding spaced from one another perpendicular to the plane of the drawing ensues via a common conveyor device TE2, FIGS. 7 and 8 being additionally referenced for their further explanation. Two conveyor means T that are again fashioned as clamps are secured to carrier in the spacing of the conveying paths leading through the two treatment cells BZ, these carriers TR being in turn attached to common holders H that extend transversely relative to the conveying direction. Guide rails FS1 and FS2 as well as guide rollers FR1 and FR2 are provided for the guidance of the individual conveyor carriages [sic] that are respectively formed of a holder H, two carriers TR and respectively ten conveyor means T arranged at these carriers TR. The round guide rail FS1 extending at the inside of the entire apparatus is secured to the collecting tank AW via angles WI in the region of the illustrated electrolytic treatment module, whereas the second guide rail FS2 having a rectangular cross-section proceeds in the region between the two treatment cells BZ. A conveyor carriage is guided on the inner guide rail FS1 with respectively two upper and two lower guide rollers FR1, whereas only a single guide roller FR2 is provided for support on the middle guide rail FS2. An endlessly circulating chain K that extends at the inside parallel to the guide rail FS1 and to whose coupling elements KG the individual holders H are coupled serves the purpose of driving the individual conveyor carriages.

The conveyor device TE2 also assumes the cathodic contacting of the printed circuit boards LP in the region of the illustrated electrolytic treatment module. To this end, the inwardly disposed part of the holders H is fashioned as power pick-up part SA that, for example, is composed of copper and conducts the current that has been picked up via the holder H, the carriers TR and the conveyor means T to the printed circuit boards LP suspended thereat. For improving the current conduction, the holder H is composed of a copper rod clad with stainless steel. The supply of current ensues via an upper live rail OS that is composed of a copper rod clad with titanium and that is secured to the collecting tank AW via a rail mount SH. A glide rail that, for example, is composed of graphite and that is resiliently pressed via spring elements FE against the power pick-up parts SA wiping thereon proceeds under the upper live rail OS. Copper cables KK are provided for the electrical bridging of the spring elements FE.

In addition to the desired metal deposition onto the traversing printed circuit boards LP, an undesired metal deposition onto the conveyor means T fashioned as clamps also ensues in the electrolytic treatment cells BZ. For eliminating these undesired metal depositions, two cleaning baths RB through which the lower region of the conveyor means T are conducted are arranged under the cover hood AH in the region of the returning side of the conveyor device TE2. The demetallization ensues by anodic etching, i.e. the conveyor means T are anodically contacted in this returning region. Otherwise, the power supply ensues in the same way as the above-explained cathodic power supply in the region of the treatment cells BZ. The structure of the cleaning baths RB, which are likewise provided with passage slots, also has a certain similarity to the structure of the treatment cells BZ. The admission of the bath liquid here ensues via admission pipes ZR, whereas outlet pipes AR are provided for the discharge and the return into the collecting tank AW. The pump required for the admission of the bath liquid is not shown in FIG. 5.

An extraction referenced AG is also situated under the above-described cleaning baths RB, this extraction being connected to a central extraction means (not shown) for generating an under-pressure within the collecting tank AW.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An apparatus for treating printed circuit boards, comprising:
    conveyor system that continuously conduct the printed circuit boards through successively arranged treatment baths, the circuit boards being in a vertical orientation, on at least two horizontal conveying paths proceeding next to one another;
    treatment cells arranged successively and next to one another for the acceptance of the treatment baths;
    vertical slots in end walls of the treatment cells for passage of the printed circuit boards;
    seals allocated to the slots;
    common collecting tanks for bath liquid emerging from treatment cells that are arranged next to one another; and
    pumps for continuous return of bath liquid from the collecting tanks into the allocated treatment cells.

2. The apparatus according to claim 1, wherein the conveyor system of the conveying paths proceeding next to one another are combined to form a common conveyor device.

3. The apparatus according to claim 2, wherein the common conveyor device is equipped with guide rollers running on guide rails.

4. The apparatus according to claim 2, wherein the conveyor system of the common conveyor device are driven by at least one endlessly circulating drive.

5. The apparatus according to claim 4, wherein the endlessly circulating drive is formed by a chain.

6. The apparatus according to claim 4, wherein at least one cleaning bath for chemical or electrochemical cleaning of the conveyor system is arranged in a region of a returning side of the endless drive.

7. The apparatus according to claim 4, wherein the endlessly circulating drive is formed by a chain.

8. The apparatus according to claim 2, wherein the conveyor system of the conveying paths proceeding next to one another are combined to form a common conveyor device.

9. The apparatus according to claim 8, wherein the common conveyor device is equipped with guide rollers running on guide rails.

10. The apparatus according to claim 8, wherein the conveyor system of the common conveyor device are driven by at least one endlessly circulating drive.

11. The apparatus according to claim 10, wherein at least one cleaning bath for chemical or electrochemical cleaning of the conveyor system is arranged in a region of a returning side of the endless drive.

12. The apparatus according to claim 1, wherein the conveyor system provides for suspended conveying of the printed circuit boards.

13. The apparatus according to claim 1, wherein return of the bath liquid ensues at least partially via spray pipes arranged in appertaining treatment cell.

14. The apparatus according to claim 13, wherein the spray pipes are vertically aligned spray pipes.

15. The apparatus according to claim 13, wherein the spray pipes are arranged at both sides of the conveying paths of the printed circuit boards.

16. The apparatus according to claim 1, wherein the apparatus further comprises a system, for introducing compressed air into the treatment baths.

17. The apparatus according to claim 1, the seals are formed by cylinders loosely arranged in pairs in vertical alignment that are pressed against one another or against respectively passing printed circuit boards by pressure of a treatment bath.

18. The apparatus according to claim 17, wherein the seals are arranged in sluice chambers attached to the treatment cells at an end side.

19. An apparatus for treating printed circuit boards, comprising:

conveyor system that continuously conduct the printed circuit boards through successively arranged treatment baths, the circuit boards being in a vertical orientation, on at least two horizontal conveying paths proceeding next to one another;

successively arranged treatment cells for acceptance of the treatment baths;

vertical slots in end walls of the treatment cells for passage of the printed circuit boards;

seals allocated to the slots;

collecting tanks for bath liquid emerging from treatment cells; and pumps for continuous return of bath liquid from the collecting tanks into the allocated treatment cells.

20. The apparatus according to claim 19, wherein the conveyor system provides for suspended conveying of the printed circuit boards.

21. The apparatus according to claim 20 wherein guides for the printed circuit boards are arranged in the treatment cells.

22. The apparatus according to claim 21, wherein guides for the printed circuit boards are arranged in the treatment cells.

23. The apparatus according to claim 19, wherein the conveyor system are clamps.

24. The apparatus according to claim 23, wherein the conveyor system are clamps.

25. The apparatus according to claim 19, wherein the apparatus further comprises contacting elements for anodic or cathodic contacting of the printed circuit boards, and electrodes with opposite polarity to the contacting elements that are arranged in electrolytic treatment cells.

26. The apparatus according to claim 25, wherein the electrodes are arranged at both sides of the conveying paths of the printed circuit boards.

27. The apparatus according to claim 25, wherein the contacting elements are formed by the conveyor system; and wherein the power supply to the conveyor system ensues with wiper contacting or roller contacting.

28. The apparatus according to claim 23, wherein the apparatus further comprises contacting elements for anodic or cathodic contacting of the printed circuit boards, and electrodes with opposite polarity to the contacting elements that are arranged in electrolytic treatment cells.

29. The apparatus according to claim 28, wherein the electrodes are arranged at both sides of the conveying paths of the printed circuit boards.

30. The apparatus according to claim 28, wherein the contacting elements are formed by the conveyor system; and wherein the power supply to the conveyor system ensues with wiper contacting or roller contacting.

31. The apparatus according to claim 19, wherein return of the bath liquid ensues at least partially via spray pipes arranged in appertaining treatment cell.

32. The apparatus according to claim 31, wherein the spray pipes are vertically aligned spray pipes.

33. The apparatus according to claim 31, wherein the spray pipes are arranged at both sides of the conveying paths of the printed circuit boards.

34. The apparatus according to claim 19, wherein the apparatus further comprises a system for introducing compressed air into the treatment baths.

35. The apparatus according to claim 2, wherein the seals are formed by cylinders loosely arranged in pairs in vertical orientation that are pressed against one another or against respectively passing printed circuit boards by pressure of a treatment bath.

36. The apparatus according to claim 35, wherein the seals are arranged in sluice chambers attached to the treatment cells at an end side.

* * * * *